(12) United States Patent
Chason et al.

(10) Patent No.: US 6,649,852 B2
(45) Date of Patent: Nov. 18, 2003

(54) MICRO-ELECTRO MECHANICAL SYSTEM

(75) Inventors: Marc Chason, Schaumburg, IL (US); Andrew Skipor, West Chicago, IL (US); Aroon Tungare, Winfield, IL (US); Daniel Gamota, Palatine, IL (US); Sanjar Ghaem, Chesapeak, VA (US)

(73) Assignee: Motorola, Inc., Schaumburg, IL (US)

( * ) Notice: Subject to any disclaimer, the term of this patent is extended or adjusted under 35 U.S.C. 154(b) by 165 days.

(21) Appl. No.: 09/929,750

(22) Filed: Aug. 14, 2001

(65) Prior Publication Data
US 2003/0034239 A1 Feb. 20, 2003

(51) Int. Cl.⁷ .................... H01H 39/00; H01L 1/10; B81B 5/00
(52) U.S. Cl. ........................ 200/181; 333/262
(58) Field of Search .................. 200/181, 600; 333/101–108, 262; 310/308–310; 257/415–421

(56) References Cited

U.S. PATENT DOCUMENTS

| | | | |
|---|---|---|---|
| 4,959,515 A | * | 9/1990 | Zavracky et al. ........... 200/181 |
| 5,051,643 A | | 9/1991 | Dworsky et al. |
| 5,258,591 A | * | 11/1993 | Buck ........................... 200/181 |
| 5,367,136 A | * | 11/1994 | Buck ........................... 200/600 |
| 5,578,976 A | | 11/1996 | Yao |
| 5,638,946 A | * | 6/1997 | Zavracky .................... 200/181 |
| 6,054,659 A | * | 4/2000 | Lee et al. ................... 200/181 |
| 6,100,477 A | * | 8/2000 | Randall et al. ............. 200/181 |

* cited by examiner

Primary Examiner—J. R. Scott
(74) Attorney, Agent, or Firm—Daniel K. Nichols

(57) ABSTRACT

The organic MEMS according to the present invention comprises a polymeric substrate comprising a substrate surface including a first region and a second region. A polymer coating is applied to the first region to provide a coating surface that is spaced apart from the substrate surface. A terminal is disposed on the second region. A metallic trace is affixed to the coating surface such that the metallic trace forms a flexible extension over the second region. The extension has a rest position where the extension is spaced apart from the terminal, and a flexed position where the extension is disposed towards the terminal. An actuator is used to provide an electric field to deflect the extension from the rest position to the flexed position. By changing the spacing between the extension and the terminal, it is possible to change the electrical condition provided by the MEMS.

31 Claims, 2 Drawing Sheets

MICRO-ELECTRO MECHANICAL SYSTEM

FIELD OF THE INVENTION

The present invention relates to an organic micro-electro mechanical system that can be fabricated within or on the surface of an organic Printed Wiring Board (PWB) utilizing high density interconnect (HDI) substrate technology.

BACKGROUND OF THE INVENTION

Smaller and more complex electronic devices require smaller switches. Current solid-state switches are not ideal, because they exhibit a finite leakage that precludes a complete "off" state. On the other hand, current mechanical and electro-mechanical switches are bulky and consume a large amount of power. Micro electro-mechanical systems (MEMS) have been reported to address the drawbacks of the prior art. See U.S. Pat. No. 5,051,643 to Dworsky and Chason, 1991; and U.S. Pat. No. 5,578,976 to Yao, 1996. However, the above-referenced MEMS are fabricated from crystalline silicon or ceramic silicon dioxide that require fabrication methods (e.g., reactive ion etching, vapor deposition, etc.) that are not compatible with printed wiring board (PWB) fabrication. Therefore, MEMS made by this technology must be made separately, then incorporated into printed wiring boards.

Moreover, crystalline silicon or silicon dioxide ceramic tends to be stiff. Accordingly, these materials are only useful for making switches that have relatively small gaps (e.g., $\leq 1$ micron), not switches having relatively large gaps (e.g., >1 micron), and these switches require a higher activation voltage than switches having a lower elastic modulus. It would be desirable to form MEMS switches that are not based on crystalline silicon or ceramic silicon dioxide.

The organic MEMS according to the present invention can be fabricated during fabrication of the printed wiring board (PWB), and are useful for switches having a wide range of gaps (about 1–25 microns). The organic MEMS comprises a polymeric substrate comprising a substrate surface including a first region and a second region. A polymer coating is applied to the first region to provide a coating surface that is spaced apart from the substrate surface. A terminal is disposed on the second region. A metallic trace is affixed to the coating such that the metallic trace forms a flexible extension over the second region. The extension has a rest position where the extension is spaced apart from the terminal, and a flexed position where the extension is disposed towards the terminal. An actuator is used to provide an electric field to deflect the extension from the rest position to the flexed position. By changing the spacing between the extension and the terminal, it is possible to change the electrical condition provided by the organic MEMS. Because, the extension is not supported by a material such as crystalline silicon or silicon dioxide ceramic, the organic MEMS is compatible with PWB fabrication, and provides a wider range of deflection gaps at a lower activation voltage.

The extension and the terminal need not contact each other to change the electrical condition provided by the organic MEMS. By changing the distance between the extension and the terminal, a variable capacitor is formed, wherein in the rest position, the MEMS has one capacitance, while in the flexed position, the MEMS has another capacitance. The organic MEMS and the method of fabrication are compatible with PWB fabrication and are used to make PWB embedded switches and capacitors.

The present invention is also directed to a method of forming the organic MEMS comprising depositing an electrode at the second region of a polymeric substrate comprising a substrate surface including a first region and a second region, then applying a photopolymer coating over both regions and the electrode. The photopolymer is selectively irradiated in the first region to form an insoluble coating in the first region, while a soluble coating remains in the second region. A metal trace is fixed to the coating such that a flexible extension overlaps the electrode. The soluble coating is removed to expose the electrode such that the electrode is spaced apart from the extension.

DETAILED DESCRIPTION OF THE DRAWINGS

Figure 1A:
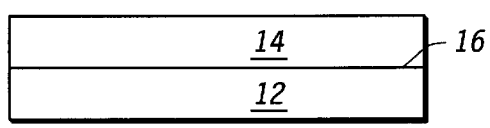
FIGS. 1A through 1J show cross-sectional views that illustrate the steps for making two MEMS embodiments having a cantilever extension.
Figure 1F:
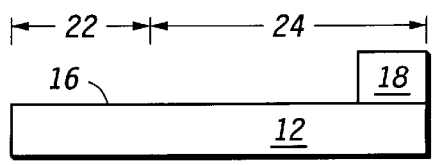
Figure 1B:
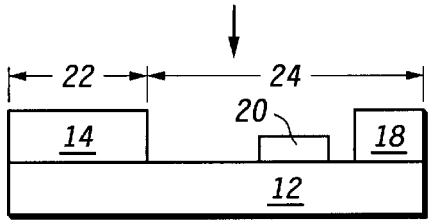

In FIG. 1, a polymer substrate 12 with a metal layer 14 on substrate surface 16 (FIG. 1A) is treated to form electrodes 18 and 20 in second region 24, such that metal layer 14 remains in first region 22 (FIG. 1B). As is indicated in FIG. 1B, first and second regions 22 and 24 are adjacent. Formation of electrodes 18 and 20 can be accomplished using metal print and etch processes widely known in the printed wiring board industry. Photopolymer 26 is applied over both regions of the substrate, including metal layer 14 and electrodes 18 and 20, and selectively irradiated in region 22 with radiation so that the photopolymer becomes insoluble in that region (FIG. 1C). A metal trace 28 is fabricated on photopolymer 26 over both first and second regions 22 and 24, respectively (FIG. 1D). The metal trace 28 can be formed, for example, by first laminating a metal foil (such as copper) to the photopolymer layer using low temperature lamination, and then printing and etching the metal to form the metal trace 28. To form MEMS 36, photopolymer 26 in region 24 that was not exposed to the radiation is removed by dissolving in a suitable solvent. An insoluble coating 30 over first region 22 on which metal trace 28 is fixed on coating surface 32, and an extension 34 over second region 24, set apart from electrodes 18 and 20 (FIG. 1E), is thus formed.

For MEMS 36, electrode 18 is shown to be thicker than electrode 20. In one embodiment, the shorter height of electrode 20 can be achieved, for example, by selectively thinning the electrode metal using controlled depth etching processes known in the printed wiring board industry. Accordingly, when MEMS 36 is a switch, electrode 20 is the actuator and electrode 18 is the terminal. As an electric field is created at electrode 20, extension 34 is drawn towards electrode 20 until extension 34 makes contact with electrode 18 in order to complete a circuit. Alternatively, when MEMS 36 is a variable capacitor, electrode 18 is an actuator. As an electric field is created at electrode 18, extension 34 is drawn towards electrode 18 until extension 34 makes contact with electrode 18. As the extension 34 is deflected from a rest state to a flexed state, the gap between extension 34 and electrode 20 changes. The different gaps produce different capacitance states between extension 34 and electrode 20. Those skilled in the art would recognize alternative embodiments, such as, for example, having a thicker electrode 20 than electrode 18 (not shown).

Figure 1G:
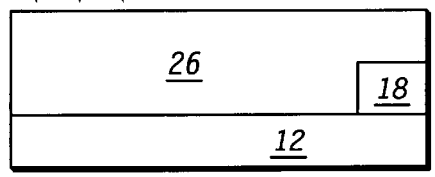
Figure 1C:
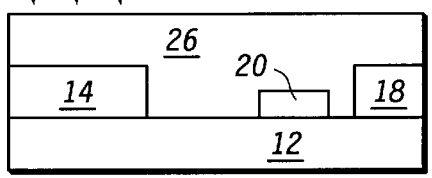
Figure 1H:
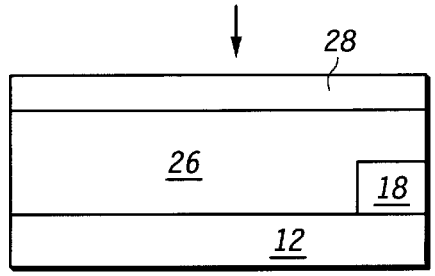
Figure 1D:
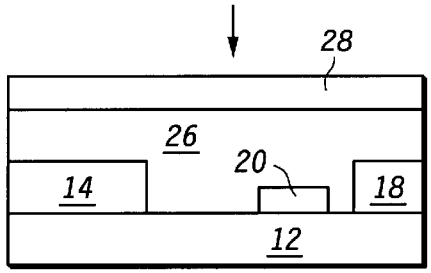
Figure 1I:
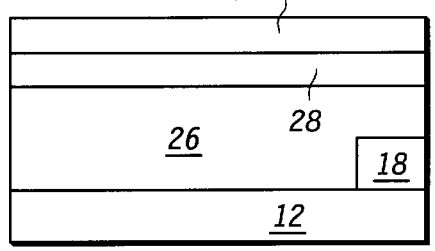
Figure 1E:
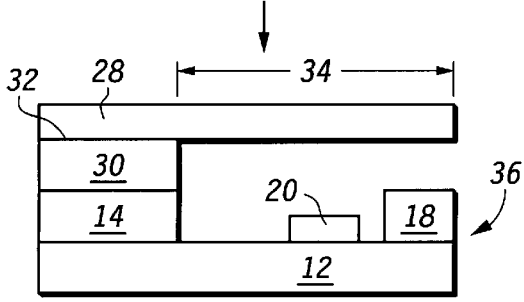
Figure 1J:
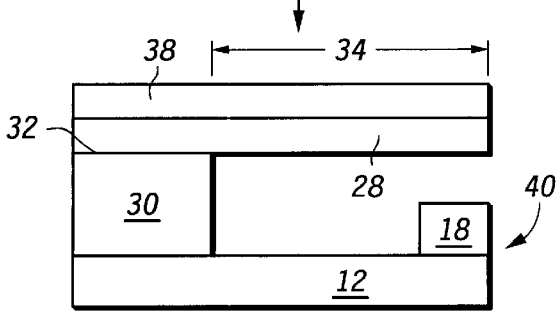

In FIG. 1F, only electrode 18 is formed in the second region 24 on surface 16. As described above, photopolymer 26 is applied, then selectively irradiated in first region 22 (FIG. 1G). Metal trace 28 is fabricated on photopolymer 26 over both the first and second regions 22 and 24, respectively (FIG. 1H). A polymer backing 38 can be formed over metal trace 28 (FIG. 1I). MEMS 40 is formed when soluble photopolymer 26 is selectively removed to form insoluble coating 30, on which metal trace 28 is fixed on coating surface 32 and forms an extension 34 over second region 24, set apart from electrode 18 (FIG. 1J) In this embodiment, electrode 18 is both the actuator and the terminal.

Examples of polymer substrate encompass any PWB material, such as polymers and reinforced polymer composites. Common resin vary from epoxy to Teflon. Common reinforcing materials include woven or non-woven glass fabrics or organic fibers (e.g., aromatic polyamide polymer—aramid paper). Particular materials include epoxy, polyamide, polyimide, modified epoxy, BT epoxy, cyanate ester, PTFE, E-glass, S-glass, aramid paper, FR-4, modified epoxy-aramid, modified epoxy-SI-glass, CE-E-glass and PTFE (Gore).

Any polymer can form the coating for the MEMS according to the present invention, including photopolymers. In one embodiment, the polymer can be a photopolymer such as an HDI photoimageable dielectric. Examples of such photopolymers, included for example only and not as limitations on the scope of the present invention, can be Probelec™ 7081 (Ciba Specialty Chemicals) or ViaLux™ 81 (DuPont) HDI photoimageable dielectric. After the soluble polymer is selectively removed, the insoluble coating may be cured.

The conductive components of the MEMS, such as the electrodes and metal trace are fabricated by known methods. Examples include electroless or electroplate deposition of copper, gold, aluminum, platinum, nickel, silver, chrome, palladium, tin, bismuth, indium, lead, and alloys thereof, such as gold-palladium. The metal can also be laminated on the polymer substrate. Examples include electroless or electroplate deposition of copper, gold, aluminum, platinum, nickel, silver, chrome, palladium, tin, bismuth, indium, lead, and alloys thereof, such as gold-palladium. To define the conductive components, the plated or laminated metals are pattern etched by wet or dry etch methods.

As shown in FIG. 1I, in addition to the metal trace, the extension described herein has an optional backing that is not made from crystalline silicon or ceramic silicon dioxide. Such backings are made from organic dielectric materials, such as, for example, epoxies, polyacrylates or polyimides. For example, in one embodiment presented as an example and not to limit the scope of the present invention, the backing material can be epoxy polyacrylate. Photoimageable dielectrics may also be used as backing materials. Extensions can be made from Cu-clad polyimide, epoxy resin coated foil (RCF), or copper, for example. Use of just the metal or a metal with a polymer backing, provides a switch that requires less activation voltage, and can be used to close larger gaps. The extension described herein may take many forms, such as a simply supported beam, a cantilever beam, plate or diaphragm.

Figure 2A:
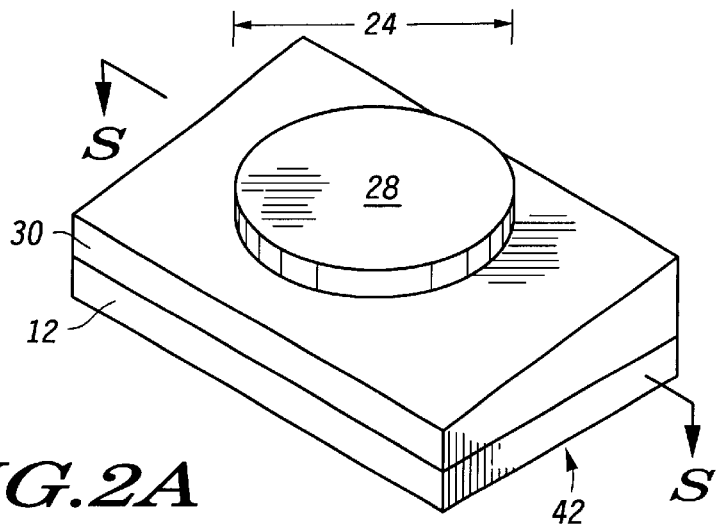
FIG. 2A shows an organic MEMS in which the metal trace defines a diaphragm extension.
Figure 2B:
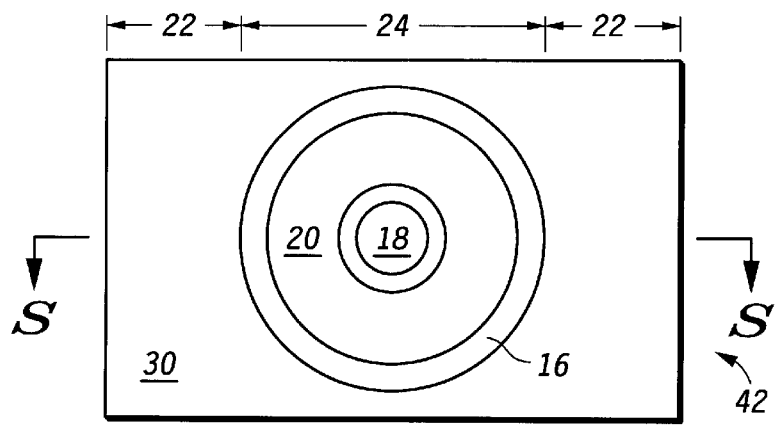
FIG. 2B shows a top view the MEMS of FIG. 2A in which the diaphragm extension has been removed to expose the dielectric surface.
Figure 2C:
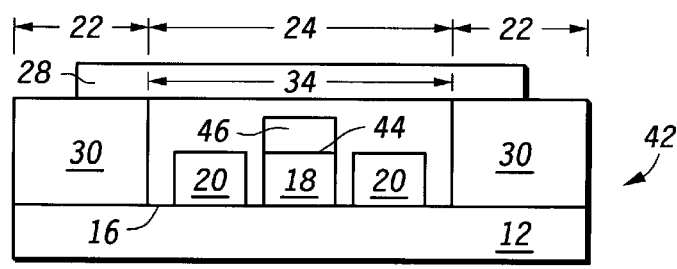
FIGS. 2C and 2D show cross-sectional views of the MEMS of FIGS. 2A and 2B a cross line S—S.
Figure 2D:
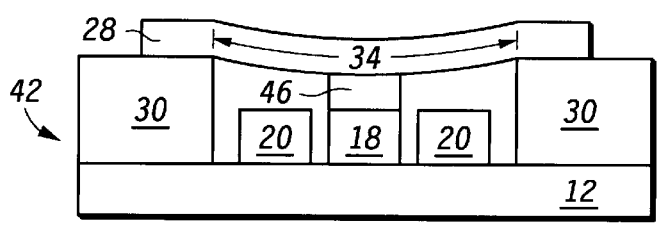

FIG. 2A shows MEMS 42 with a metal trace 28 that forms a diaphragm on coating 30 and over polymer substrate 12. FIG. 2B shows a top view of MEMS 42 in which the metal trace is removed to reveal substrate surface 16 in second region 24, with electrode 20 forming a concentric ring around dielectric layer 46. FIGS. 2C and 2D are cross-sectional views of MEMS 42 across line S—S, showing polymeric substrate 12 with surface 16 having adjacent first region 22 and second region 24. Metal trace 28 is fixed on the insoluble coating 30, and forms an extension 34 over second region 24. Electrode 20 and electrode 18 are disposed in second region 24, on surface 16. As shown in MEMS 42, electrode 18 could have a dielectric layer 46 on an electrode surface 44. The dielectric layer could be ceramic, polymer, oxide or a polymer-inorganic material. FIG. 2C shows MEMS 42 in a rest position where extension 34 is set apart from electrode 18. FIG. 2D shows MEMS 42 in a flexed position where electrode 20, as the actuator, has deflected extension 34 to contact dielectric ceramic layer 46 on electrode 18.

One advantage of the organic MEMS and process for forming the organic MEMS according to the present invention, is the compatibility of the MEMS and PWB fabrication process. Such MEMS can be embedded in an HDI layer, fabricated on the PWB surface, or over a metal or dielectric layer on the PWB or any substrate surface. As part of the HDI fabrication, the organic MEMS is used as an electronic circuit element in connecting resistors, capacitors and inductors embedded in the substrate, or placed on the substrate providing for optimal circuit performance, reducing inductance by reducing the length of the signal path between an IC I/O and the electronic circuit element, and minimizing assembly costs.

While the present invention has been described in terms of particular embodiments, it is apparent that one skilled in the art can adopt other forms without departing from the scope and spirit of this invention. Accordingly, the scope of the invention is limited only by the literal and equivalent scope of the claims that follow. In addition, any art cited herein is incorporated by reference.

We claim:

1. An electronic circuit element comprising:
   a substrate comprising a substrate surface including a first region and a second region adjacent to the first region;
   a polymer coating applied to the first region, the polymer coating including a coating surface spaced apart from the substrate surface;
   a terminal disposed on the second region;
   a metallic trace affixed to the coating surface such that the metallic trace forms an extension over the second region, whereby the extension has a rest position where the extension is spaced apart from the terminal, and a flexed position where the extension is disposed towards the terminal; and
   an actuator comprising an electrode disposed on the second region at which an electric field can be created effective to flex the extension from the rest position to the flexed position.

2. The electronic circuit element of claim 1 wherein the substrate is selected from the group consisting of polymer, ceramic, silicon, gallium arsenide, semiconductor, metal, and glass.

3. The electronic circuit element of claim 1 wherein the polymer coating is formed of a photopolymer.

4. The electronic circuit element of claim 1 wherein the polymer coating is formed of a material selected from the group consisting of polyimide and epoxy.

5. The electronic circuit element of claim 1 wherein the polymer coating is formed of photoimageable polymer.

6. The electronic circuit element of claim 1 wherein the substrate is a reinforced polymer composite.

7. The electronic circuit element of claim 1 wherein a metal layer is interposed between the substrate and the polymer coating.

8. The electronic circuit element of claim 1 where in the extension has a free end that is remote from a fixed end on the polymer coating.

9. The electronic circuit element of claim 1 wherein the extension has a free end that is remote from a fixed end on the polymer coating and is simply supported.

10. The electronic circuit element of claim 1 wherein the extension bridges the second region.

11. The electronic circuit element of claim 10 wherein the extension forms a diaphragm over the second region.

12. The electronic circuit element of claim 10 wherein the extension forms a plate over the second region.

13. The electronic circuit element of claim 1 wherein the terminal is also the actuator.

14. The electronic circuit element of claim 1 wherein the terminal is distinct from the actuator.

15. The electronic circuit element of claim 1 wherein the extension in the flexed position makes contact with the terminal.

16. The electronic circuit element of claim 1 wherein there is a gap between the extension and the terminal when the extension is in the flexed position.

17. The electronic circuit element of claim 1 wherein the extension forms a plate over the second region.

18. The electronic circuit element of claim 1 wherein the extension forms a diaphragm over the second region.

19. The electronic circuit element of claim 1 wherein the extension forms a cantilever having a free end over the second region.

20. A printed wiring board having a switch, the switch comprising:
    a substrate comprising a substrate surface including a first region and a second region adjacent to the first region;
    a polymer coating applied to the first region, the polymer coating including a coating surface spaced apart from the substrate surface;
    a terminal disposed on the second region;
    a metallic trace affixed to the coating surface such that the metallic trace forms a extension over the second region, the extension having a rest position wherein the extension is spaced apart from the terminal and a flexed position wherein the extension is disposed towards the terminal; and
    an actuator disposed on the second region capable of creating an electric field effective to flex the extension from the rest position to the flexed position.

21. The printed wiring board of claim 20 wherein the extension contacts the terminal in the flexed position.

22. The printed wiring board of claim 20 wherein there is a gap between the extension and the terminal when the extension is in the flexed position.

23. The printed wiring board of claim 20 wherein the extension forms a plate over the second region.

24. The printed wiring board of claim 20 wherein the extension forms a diaphragm over the second region.

25. The printed wiring board of claim 20 wherein the extension forms a cantilever having a free end over the second region.

26. The printed wiring board of claim 20 wherein the extension is supported by an organic polymer backing.

27. A printed wiring board having a variable capacitor, the variable capacitor comprising:
    a substrate comprising a substrate surface including a first region and a second region adjacent to the first region;
    a polymer coating applied to the first region, the polymer coating including a coating surface spaced apart from the substrate surface;
    a terminal disposed on the second region;
    a metallic trace affixed to the coating surface such that the metallic trace forms a extension over the second region, the extension having a rest position wherein the extension is spaced apart from the terminal and a flexed position wherein the extension is disposed towards the terminal; and
    an actuator disposed on the second region capable of creating an electric field effective to flex the extension from the rest position to the flexed position.

28. The printed wiring board of claim 27 wherein the extension is spaced apart from the terminal by a first gap in the rest position and the extension is spaced apart from the terminal by a second gap less than the first gap in the flexed position.

29. The printed wiring board of claim 27 further comprising a dielectric layer disposed between the terminal and the extension, such that there is a gap between the extension and the dielectric layer when the extension is in the rest position and the extension contacts the dielectric layer when the extension is in the flexed position.

30. The printed wiring board of claim 29 wherein the dielectric layer is selected from the group consisting of ceramic, polymer, oxide, and a polymer-inorganic material.

31. The printed wiring board of claim 27 wherein the substrate is selected from the group consisting of polymer, ceramic, silicon, gallium arsenide, semiconductor, metal, and glass.

* * * * *